(12) United States Patent
Kim et al.

(10) Patent No.: US 8,916,852 B2
(45) Date of Patent: Dec. 23, 2014

(54) ORGANIC LIGHT EMITTING DISPLAY HAVING A SUBSTRATE SUPPORT STRUCTURE AND FABRICATING METHOD THEREOF

(75) Inventors: JongYun Kim, Yongin-si (KR); Byoungdeog Choi, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1165 days.

(21) Appl. No.: 11/785,098

(22) Filed: Apr. 13, 2007

(65) Prior Publication Data

US 2008/0142791 A1    Jun. 19, 2008

(30) Foreign Application Priority Data

Dec. 13, 2006 (KR) .......................... 10-2006-127290

(51) Int. Cl.
| H01J 1/62  | (2006.01) |
| H05B 33/00 | (2006.01) |
| H01L 51/52 | (2006.01) |
| H01L 51/00 | (2006.01) |
| H01L 51/56 | (2006.01) |

(52) U.S. Cl.
CPC ......... H01L 51/5237 (2013.01); H01L 51/0097 (2013.01); H01L 51/56 (2013.01); H01L 2251/5338 (2013.01)
USPC .................................... 257/40; 257/E51.005

(58) Field of Classification Search
USPC ........................................... 257/E51.005, 40
See application file for complete search history.

(56) References Cited

U.S. PATENT DOCUMENTS

| 4,735,847 | A  | * | 4/1988  | Fujiwara et al. ............... 428/209 |
| 5,504,605 | A  | * | 4/1996  | Sakuma et al. .................. 349/58  |
| 5,811,866 | A  |   | 9/1998  | Hirata |
| 5,986,401 | A  |   | 11/1999 | Thompson et al. |
| 6,559,594 | B2 |   | 5/2003  | Fukunaga et al. |
| 6,597,113 | B1 |   | 7/2003  | Nitta |
| 6,633,124 | B2 | * | 10/2003 | Himeshima et al. .......... 313/506 |
| 6,815,240 | B2 |   | 11/2004 | Hayashi |
| 7,083,863 | B2 |   | 8/2006  | Satou et al. |
| 7,223,636 | B2 | * | 5/2007  | Kobayashi et al. ........... 438/110 |
| 7,276,291 | B2 | * | 10/2007 | Bright ........................... 428/458 |

(Continued)

FOREIGN PATENT DOCUMENTS

| CN | 1423513 | 6/2003  |
| CN | 1450837 | 10/2003 |

(Continued)

OTHER PUBLICATIONS

Avis relatif au rapport de recherche europeenne issued on Mar. 19, 2008 by the European EPO in the corresponding European Application of U.S. Appl. No. 11/785,043.

(Continued)

Primary Examiner — Julio J Maldonado
Assistant Examiner — Mohammad Choudhry
(74) Attorney, Agent, or Firm — Robert E. Bushnell, Esq.

(57) ABSTRACT

An organic light emitting display including a substrate, a semiconductor layer formed on the substrate, an organic light emitting diode formed on the semiconductor layer, an encapsulant formed on a periphery of the substrate which is an outer periphery of the organic light emitting diode and the semiconductor layer; and an encapsulation substrate attached to the encapsulant.

20 Claims, 8 Drawing Sheets

(56) References Cited

U.S. PATENT DOCUMENTS

| | | | |
|---|---|---|---|
| 7,407,716 B2* | 8/2008 | Patwardhan et al. | 428/690 |
| 2001/0011868 A1 | 8/2001 | Fukunaga et al. | |
| 2003/0010062 A1 | 1/2003 | Matthies | |
| 2003/0020124 A1* | 1/2003 | Guenther | 257/400 |
| 2003/0082889 A1 | 5/2003 | Maruyama et al. | |
| 2003/0094894 A1 | 5/2003 | Andry et al. | |
| 2003/0107326 A1 | 6/2003 | Park et al. | |
| 2003/0155860 A1 | 8/2003 | Choi et al. | |
| 2003/0230971 A1 | 12/2003 | Arakawa et al. | |
| 2004/0129960 A1 | 7/2004 | Maruyama et al. | |
| 2004/0135148 A1 | 7/2004 | Lin | |
| 2004/0135164 A1* | 7/2004 | Park et al. | 257/99 |
| 2004/0178723 A1 | 9/2004 | Yasukawa et al. | |
| 2004/0191963 A1* | 9/2004 | Pichler | 438/127 |
| 2004/0251827 A1* | 12/2004 | Kang et al. | 313/512 |
| 2004/0253838 A1 | 12/2004 | Yamazaki et al. | |
| 2005/0002081 A1 | 1/2005 | Beteille et al. | |
| 2005/0029926 A1 | 2/2005 | Park et al. | |
| 2005/0045917 A1 | 3/2005 | Yamazaki et al. | |
| 2005/0046340 A1* | 3/2005 | Kohara et al. | 313/504 |
| 2005/0046783 A1 | 3/2005 | Kawata et al. | |
| 2005/0067945 A1 | 3/2005 | Nishikawa et al. | |
| 2005/0067950 A1* | 3/2005 | Nonoue et al. | 313/504 |
| 2005/0101052 A1* | 5/2005 | Kobayashi et al. | 438/106 |
| 2005/0164470 A1* | 7/2005 | Yamazaki et al. | 438/455 |
| 2005/0211990 A1 | 9/2005 | Lee et al. | |
| 2005/0218409 A1* | 10/2005 | Um et al. | 257/72 |
| 2005/0285522 A1* | 12/2005 | Han et al. | 313/512 |
| 2007/0048895 A1 | 3/2007 | Suginoya et al. | |
| 2007/0188085 A1 | 8/2007 | Young | |
| 2008/0111125 A1 | 5/2008 | Kim | |
| 2008/0111126 A1 | 5/2008 | Kim | |
| 2008/0111477 A1 | 5/2008 | Kim | |
| 2008/0128683 A1 | 6/2008 | Kim et al. | |
| 2008/0142791 A1 | 6/2008 | Kim et al. | |

FOREIGN PATENT DOCUMENTS

| | | | |
|---|---|---|---|
| EP | 1584971 A1 | 10/2005 | |
| JP | 198417810 B | 4/1984 | |
| JP | 09211482 A | 8/1997 | |
| JP | 10221700 | 8/1998 | |
| JP | 2000150145 | 5/2000 | |
| JP | 2000268735 | 9/2000 | |
| JP | 2000298264 A | 10/2000 | |
| JP | 2001-053290 | 2/2001 | |
| JP | 2001319776 | 11/2001 | |
| JP | 2002-350833 | 12/2002 | |
| JP | 2003173872 A | 6/2003 | |
| JP | 2003282235 | 10/2003 | |
| JP | 2003317953 | 11/2003 | |
| JP | 2004170910 | 6/2004 | |
| JP | 2004205601 | 7/2004 | |
| JP | 2005-085705 | 3/2005 | |
| JP | 2005071693 | 3/2005 | |
| JP | 2005085738 A | 3/2005 | |
| JP | 2005183414 | 7/2005 | |
| JP | 2005-222789 | 8/2005 | |
| JP | 2005-222930 | 8/2005 | |
| JP | 2005-284252 A | 10/2005 | |
| JP | 2005284252 | 10/2005 | |
| JP | 2005-340011 A | 12/2005 | |
| JP | 2005-340182 | 12/2005 | |
| JP | 2005340168 | 12/2005 | |
| JP | 2006-058814 A | 3/2006 | |
| JP | 2006-270511 | 10/2006 | |
| JP | 2007122984 A | 5/2007 | |
| JP | 2007531001 A | 11/2007 | |
| JP | 2008141151 | 6/2008 | |
| KR | 1020030009913 A | 2/2003 | |
| KR | 1020030054777 A | 7/2003 | |
| KR | 1020030069434 A | 8/2003 | |
| KR | 1020040010186 A | 1/2004 | |
| KR | 1020040106808 A | 12/2004 | |
| KR | 1020050012958 A | 2/2005 | |
| KR | 1020050029826 A | 3/2005 | |
| KR | 1020050051646 A | 6/2005 | |
| KR | 1020050059259 A | 6/2005 | |
| KR | 1020050064352 A | 6/2005 | |
| KR | 1020060089638 A | 8/2006 | |
| KR | 1020060099743 A | 9/2006 | |
| KR | 10-2006-0124940 | 12/2006 | |
| KR | 1020070014494 A | 2/2007 | |
| KR | 1020070047633 A | 5/2007 | |
| WO | 2004075607 A1 | 9/2004 | |
| WO | 2005093700 A2 | 10/2005 | |

OTHER PUBLICATIONS

Office Action (Paper No. 20100724) mailed on Jul. 28, 2010 for U.S. Appl. No. 11/785,043.
Office Action (Paper No. 20100314) mailed on Mar. 18, 2010 for U.S. Appl. No. 11/785,043.
Office Action (Paper No. 20100604) mailed on Jun. 9, 2010 for U.S. Appl. No. 11/785,099.
Office Action (Paper No. 20090428) mailed on May 12, 2009 for U.S. Appl. No. 11/785,099.
Office Action (Paper No. 20100717) mailed on Jul. 23, 2010 for U.S. Appl. No. 11/785,101.
Office Action (Paper No. 20090610) mailed on Jun. 26, 2010 for U.S. Appl. No. 11/785,044.
Office Action (Paper No. 20080812) mailed on Aug. 21, 2008 for U.S. Appl. No. 11/785,044.
Office Action (Paper No. 20080613) mailed on Jul. 15, 2008 for U.S. Appl. No. 11/785,044.
Office Action (Paper No. 20080118) mailed on Jan. 22, 2008 for U.S. Appl. No. 11/785,044.
Japanese Office Action issued on Jul. 2, 2013 in the corresponding Japanese Patent Application No. 2011-123294 of the cross-referenced U.S. Appl. No. 11/785,099.
Japanese Office Action issued May 29, 2012 in connection with Japanese Patent Application Serial No. 2010-177466, which also claims Korean Patent Application Serial No. 10-2006-0127290 as its priority document, and Request for Entry of the Accompanying Office Action attached herewith.
Japanese Notice of Allowance issued by JPO, dated Jan. 25, 2011, corresponding to Japanese Patent Application No. 2007-109771, together with Request for Entry.
European Examination Report issued by European Patent Office on Oct. 25, 2012 corresponding to European Patent Application No. 07252153.7. (Cited in Applicants' cross-referenced U.S. Appl. No. 11/785,043).
European Extended Search Report issued on Nov. 2, 2010 in the European Application No. 07252164.4. (Cited in the IDS filed on Jan. 12, 2011 in the U.S. Appl. No. 11/785,101).

* cited by examiner

ORGANIC LIGHT EMITTING DISPLAY HAVING A SUBSTRATE SUPPORT STRUCTURE AND FABRICATING METHOD THEREOF

CLAIM OF PRIORITY

This application makes reference to, incorporates the same herein, and claims all benefits accruing under 35 U.S.C. §119 from an application for ORGANIC LIGHT EMITTING DISPLAY AND FABRICATING METHOD THEREOF earlier filed in the Korean Intellectual Property Office on the 13$^{th}$ day of Dec. 2006 and there duly assigned Serial No. 10-2006-0127290.

BACKGROUND OF THE INVENTION

1. Field of the Invention

The present invention relates to an organic light emitting display and a fabrication method thereof and, more particularly, the present invention relates to a thin organic light emitting display having a reduced fabricating process time and can prevent a substrate from being bent and damaged during the fabricating process.

2. Description of the Related Art

Generally, an organic light emitting display self-emits light by causing an electric current to flow through a fluorescent or phosphorescent organic compound and allowing an electron and a hole to be coupled to each other. Moreover, an organic light emitting display can display an image by driving organic light emitting diodes, for example, n by m organic light emitting diodes, by a voltage or a current.

As illustrated in FIG. 1, organic light emitting diodes have a basic structure including an anode (ITO), an organic thin layer and a cathode electrode (metal). The organic thin layer is composed of an EMitting Layer (EML) which emits light when the electrons and the holes meet and thereby form an exciton, an Electron Transport Layer (ETL) for controlling the moving speed of the electrons, and a Hole Transport Layer (HTL) for controlling the moving speed of the holes. An Electron Injecting Layer (EIL) is further formed in the ETL for improving the effectiveness of the injection of electrons, and, a Hole Injecting Layer (HIL) is further formed in the Hole Transport Layer for improving the effectiveness of the injection of holes.

The organic light emitting display is by no means inferior to other devices because of a wide range of vision, a super high-speed response, and spontaneous light emitting, and it is possible to fabricate a thin light-weight device since the power consumption is low and a backlight is not required. Since it is fabricated at a low temperature and the fabricating processes are simple, the device is fabricated at a low cost. As an organic thin layer material technology and the process technology are being developed rapidly, they are considered to be the technology which can replace the conventional flat display device.

Meanwhile, since electronic devices, such as cellular telephones, Personal Digital Assistants (PDAs), notebook computers, computer monitors, televisions and so forth, have becomes slimmer, it is necessary for the organic light emitting display to have a thickness below about 1 mm. However, in the present organic light emitting displays, since a protective layer technology that can substitute for an encapsulation technology has not been sufficiently developed, it is difficult to fabricate an organic light emitting display having a thickness below 1 mm.

In order to fabricate the organic light emitting display having a thickness below 1 mm, Japanese Laid-Open Patent Publications Nos. 2005-340182, 2005-222930 and 2005-222789 relate to a method of fabricating a thin organic light emitting display in which element layers (a semiconductor layer and an organic light emitting diode, etc.) are respectively formed on two glass substrates, and the glass substrates are then bonded to each other so that the respective element layers face each other and then the surfaces on which the element layers are not formed are removed by an etching or grinding process.

However, the above-noted fabricating method has a problem in that the fabricating process time greatly increases because after the semiconductor layer or the organic light emitting diode is formed on the respective glass substrates, the glass substrates are bonded to each other and are etched or ground. Moreover, such a conventional fabricating method has a problem in that the yield of production is low and the fabricating cost is expensive because the partly finished glass substrates are bonded to each other and the glass substrate, the semiconductor layer and the organic light emitting diode is damaged during bonding process.

A fabricating method is conceivable in which after providing a glass substrate having a thickness below 1 mm, an element layer is formed on the surface of the glass substrate. However, such a fabricating method has a problem in that the glass substrate bends or contacts a moving device and is damaged during the moving process because the glass substrate is very thin.

SUMMARY OF THE INVENTION

The present invention is conceived to solve the above-mentioned problems, and the object of the present invention is to provide a thin organic light emitting display.

Another object of the present invention is to prevent the bending and damage of the substrate during the fabricating process.

Another object of the present invention is to shorten the fabricating process time of an organic light emitting display.

Another object of the present invention is to prevent a UV-rays for exposure from being illuminated on the substrate which is not desired during the fabricating process.

In order to accomplish the above-mentioned objects, an organic light emitting display according to the present invention includes a substrate; a semiconductor layer formed on the substrate; an organic light emitting diode formed on the semiconductor layer; an encapsulant formed on the periphery of the substrate which is the outer periphery of the organic light emitting diode and the semiconductor layer; and an encapsulation substrate attached to the encapsulant.

The support is formed on the side which is same as the side which the semiconductor layer is formed.

The support is formed in the vicinity of at least on one side of the substrate.

The support is formed on the outer periphery of the organic light emitting diode and the semiconductor layer.

The support is formed by any one selected from an insulating material and a conductive material.

The support is formed as being thinner as compared with the thickness of the encapsulant.

The support is formed as being thinner as compared with the entire thickness of the encapsulant and the encapsulation substrate.

In the substrate, a bonding agent is formed on a side opposing the side which the support is formed.

The bonding agent is formed in the vicinity of at least one side of the substrate.

The bonding agent is formed on the outer periphery of the organic light emitting diode and the semiconductor layer.

The substrate is formed as being larger as compared with the area of the encapsulation substrate.

The substrate having a thickness of 0.05~1 mm is formed.

The substrate is formed by any one selected from a glass, a plastic, a polymer.

In the substrate, a non-transmissive layer is further formed on a side opposing the side which the semiconductor layer is formed.

In the substrate, a non-transmissive layer has a thickness of about 500 Å to about 3,000 Å is further formed on a side opposing the side which the semiconductor layer is formed.

In the substrate, the non-transmissive layer is formed on the opposing side of which the semiconductor layer is formed by any one selected from a metal that does not transmit the UV-rays, a transparent UV-ray protective agent and an opaque UV-ray protective agent.

In the substrate, a non-transmissive layer is formed on the opposing side of which the semiconductor layer is formed by any one selected from Cr, $Cr_2O_3$, Al, Au, Ag, MgO, and silver alloy.

In the substrate, the non-transmissive layer and an anti-friction layer is further formed in sequence on the opposing side opposing of which the semiconductor layer is formed.

The anti-friction layer having a thickness of about 10-100 μm is formed.

The anti-friction layer is formed by at least one selected from an organic material and an inorganic material.

A buffer layer is formed on the under surface of the semiconductor layer; a gate insulating layer is formed on the top surface of the semiconductor layer; a gate electrode is formed on the top surface of the gate insulating layer; an inter-layer dielectric layer is formed on the top surface of the gate electrode; a source/drain electrode is formed on the top surface of the inter-layer dielectric layer; an insulating film is formed on the top surface of the source/drain electrode; and an organic light emitting diode is formed on the top surface of the insulating film.

In the substrate, a driving circuit is further formed between the outer periphery of the semiconductor layer and the inner periphery of the encapsulant.

In order to accomplish the above-mentioned objects, a method for fabricating an organic light emitting display according to the present invention includes steps of preparing a substrate on which a support is formed for preventing bending; forming a non-transmissive layer on a side opposing the side which the support is formed in the substrate; preparing two substrates, and bonding two prepared substrates by using an bonding agent while two prepared substrates and the non-transmissive layer face each other; forming a semiconductor layer on a side same as the side which the support is formed in the adhered substrates, respectively; forming the organic light emitting diode on each semiconductor layer; bonding the encapsulation substrate by injecting the encapsulant into the outer periphery of the organic light emitting diode display device on each insulating film; sawing a region corresponding to the outer periphery of the encapsulation substrate of the substrate with leaving the support in the substrate as it is; and separating two adhered substrates individually.

Preparing a substrate is that the support is formed in the vicinity of one side which sawing is performed.

Preparing a substrate is that the support is formed on the outer periphery of the organic light emitting diode and the semiconductor layer.

Preparing a substrate is that the support is formed by any one selected from an insulating material and a conductive material.

Preparing a substrate is that the support is formed as being thinner as compared with the thickness of the encapsulant.

Preparing a substrate is that support is formed as being thinner as compared with the entire thickness of the encapsulant and the encapsulation substrate.

Bonding the encapsulation substrate the bonding agent is applied to the substrate of a region corresponding to the outer periphery of the organic light emitting diode and the semiconductor layer.

Bonding the encapsulation substrate, the bonding agent is applied to the substrate of a region corresponding to the outer periphery of the encapsulant.

Preparing a substrate, the substrate having a thickness of 0.05~1 mm is formed.

Preparing a substrate is that the substrate is formed by any one selected from a glass, a plastic, a polymer.

Forming a non-transmissive layer is that a non-transmissive layer having a thickness of about 500 Å to 3,000 Å is formed.

Forming a non-transmissive layer is that the under surface of the substrate is coated with a UV-ray protective agent.

Forming a non-transmissive layer is that the non-transmissive layer is formed by any one selected from a metal which can transmit a UV-rays, a transparent UV-ray protective agent, and an opaque UV-ray protective agent.

Forming a non-transmissive layer is that the non-transmissive layer is formed by any one selected from Cr, $Cr_2O_3$, Al, Au, Ag, MgO and silver alloy.

Forming a non-transmissive layer is that an anti-friction layer is further formed on the under surface of the substrate.

Forming a non-transmissive layer is that the anti-friction layer having a thickness of 10-100 μm is formed on the under surface of the substrate.

Forming a non-transmissive layer is that the anti-friction layer is further formed by any one selected from an organic material and an inorganic material on the under surface of the non-transmissive layer.

Bonding two prepared substrates is that the anti-friction layer formed on each substrate is in contact mutually.

Bonding the encapsulation substrate is that the width of the encapsulation substrate is smaller than that of the substrate.

Sawing is executed by using a laser beam.

Sawing is executed that the bonding agent can remain in the substrate.

After separating the substrates, a step of removing the non-transmissive layer is further included.

Forming a semiconductor layer can further include a step of forming a driving circuit.

As mentioned above, since an organic light emitting display according to the present invention is formed on the substrate having a thickness of 0.05~1 mm, it is easily applied to various kinds of display electronic products as a mobile phone, PDA, a notebook, a computer monitor, and a television and so on which are recently getting slimmer.

As noted above, since an organic light emitting display according to the present invention have the non-transmissive layer to be formed on the substrate, a UV-rays does not affect a semiconductor layer or an organic light emitting display element while the products are being used.

As noted above, since the support or an bonding agent remains one side of the substrate in an organic light emitting display according to the present invention, the rigidity of a product is enhanced and thus the device can not easily damaged by the external force.

As noted above, in a method of fabricating an organic light emitting display according to the present invention, since the semiconductor process and the organic thin layer process (washing, etching, exposure, and a heat process are included in every fabricating process) is performed simultaneously after bonding two thin-type substrates having a thickness of 0.05-1 mm, the entire process time is shortened by 50%, and the substrate is protected from bending or damages during a transfer process of the substrate by enhancing the rigidity.

As noted above, in the method of fabricating an organic light emitting display according to the present invention, since a support is formed on one side of a substrate in advance, bending and damages for a substrate is prevented during a fabricating process or after a fabricating process. Therefore, an excellent semiconductor layer and an organic thin layer are formed during a fabricating process without any inferior quality.

As noted above, in the method of fabricating an organic light emitting display according to the present invention, since a non-transmissive layer is formed on the under surface of the substrate, the UV-rays generated due to the exposure process does not affect another opposing substrate during a fabricating process.

As noted above, in the method of fabricating an organic light emitting display according to the present invention, since an anti-friction layer is formed on a substrate, when bonding two substrates, damage to the substrate is prevented by preventing contact with a metal formed on the substrate or the surface of the substrate.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, the exemplary embodiment of the present invention is explained in detail below with reference to the attached drawings so that the present invention is derived by a person having ordinary skill in the field to which the present invention belongs.

Figure 1:
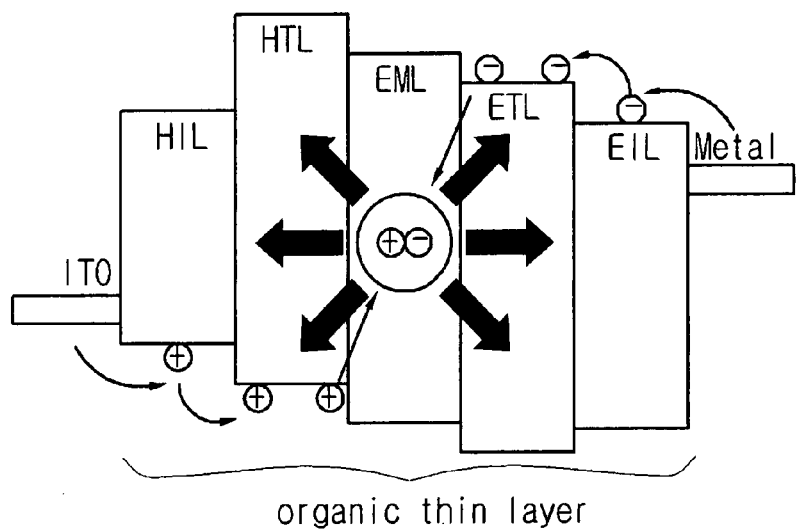
FIG. 1 is a schematic diagram of an organic light emitting display element.
Figure 2A:
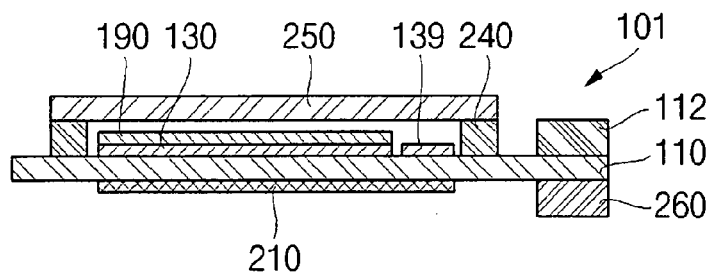
FIG. 2a and FIG. 2b are cross-sections of an organic light emitting display according to an embodiment of the present invention.
Figure 2B:
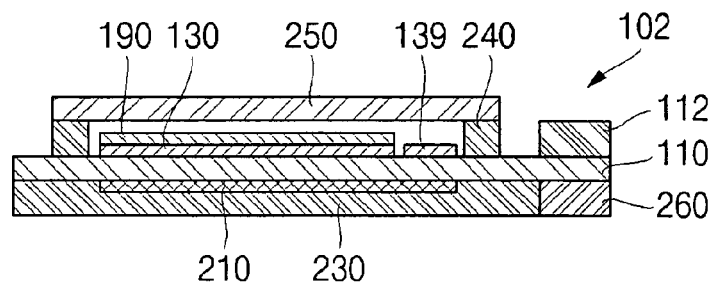

FIG. 2a and FIG. 2b are cross-sections of an organic light emitting display according to an embodiment of the present invention.

As illustrated in FIG. 2a, an organic light emitting display 101 according to an embodiment of the present invention includes a substrate 110, a semiconductor layer 130 formed on the substrate 110, a driving circuit 139 formed on one side of the semiconductor layer 130, an organic light emitting diode 190 formed on the semiconductor layer 130, an encapsulant 240 formed on an upper periphery of the substrate 110 which is the outer perimeter of the organic light emitting diode 190, the semiconductor layer 130 and the driving circuit 139, and an encapsulation substrate 250 attached to the encapsulant 240.

A support 112 having a constant thickness is further formed in the substrate 110 for preventing bending of the substrate 110 during or after a fabricating process. In particular, since bending of the substrate 110 is prevented during a fabricating process, the driving circuit 139, the semiconductor layer 130, and the organic light emitting diode 190 is formed precisely without inferior quality. The support 112 remains in the substrate 110 even after completion of the fabricating process, thus improving the rigidity of the product. This support 112 is formed on the outer perimeter of the driving circuit 139, the semiconductor layer 130, and the encapsulant 240, and the support is formed in the vicinity of at least one side of the substrate 110. If the plane shape of the substrate 110 is a quadrangle, the support 112 is in the vicinity of one side, two sides, three sides or four sides of the substrate 110. The thickness of the support 112 is less than that of the encapsulant 240, or the entire thickness of the encapsulant and the encapsulation substrate to provide a thin organic light emitting display. The support 112 is an insulating material, a conductive material, or the equivalents thereof. However, the material is not limited thereto. For example, the support 112 is formed of a reinforced plastic or stainless steel. The support 112 is attached to the substrate 110 by a bonding agent which is not illustrated. The support 112 is formed of the same material as that of the substrate 110 and the support 112 is formed simultaneously with the fabricating of the substrate 110.

The driving circuit 139 is formed on the surface of the substrate 110 between the semiconductor layer 130 and the encapsulant 240. This driving circuit 139, for example is a scan driver, a data driver, an emission driver, or a power control driver. However, the kind of driver is not limited thereto. The driving circuit 139 is formed simultaneously with the fabricating of the semiconductor layer 130.

The encapsulant 240 is an epoxy adhesive, a UV-ray setting adhesive, a frit or the equivalents thereof. However, the material is not limited thereto. If a frit is used as the encapsulant 240, since it is necessary to heat the frit to a predetermined temperature, an encapsulation process is executed using a laser beam. That is, if the laser beam is illuminated on the frit from one side after positioning the frit between the substrate 110 and the encapsulant 240, the frit starts to melt, and then the substrate 110 is strongly attached to the encapsulation substrate 250.

The encapsulation substrate 250 is formed of a transparent glass, a transparent plastic, a transparent polymer or the equivalents thereof. However, the material is not limited thereto.

In the substrate 110, a bonding agent 260 having a constant thickness is formed on the side opposite to the side on which the support 112 is formed. The drawing shows that the bonding agent 260 is formed facing the support 112 centering on the substrate 110. However, the present invention is not limited to this position. That is, the support 112 and the bonding agent 260 can also be respectively formed on positions in which they do not face each other. The bonding agent 260 is formed inevitably during the fabricating process of an organic light emitting display according to an embodiment of the present invention, but it also performs a function for reinforcing the rigidity of the substrate after completion of the product. The bonding agent 260 is formed in the vicinity of at least one side of the under surface of the substrate 110. The bonding agent 260 is formed in the vicinity of all sides of the under surface of the substrate 110. The bonding agent 260 can also be formed on the under surface of the substrate 110 corresponding to the outer periphery of the organic light emitting diode 190 and the semiconductor layer 130. The bonding agent 260 can also be formed on the under surface of the substrate 110 corresponding to the outer periphery of the encapsulant 240 and the encapsulation substrate 250. The bonding agent 260 is an epoxy adhesive, a UV-ray setting adhesive, or the equivalents thereof. However, the bonding agent 260 material is not limited thereto. The bonding agent 260 having a thickness of about 10~100 μm is formed. If the thickness of the bonding agent 260 is less than 10 μm, two substrates 110 is in contact during a fabricating process and the rigidity is feeble, and if the thickness of the bonding agent 260 is more than 100 μm, the two substrates 110 iscome excessively thick. The range of the substrate 110 must be greater than that of the encapsulant so that the bonding agent 260 is positioned on the outer periphery of the organic light emitting diode 190, the semiconductor layer 130, the encapsulant 240 and the encapsulation substrate 250.

On the contrary, the non-transmissive layer 130 is further formed on the top surface of the substrate 110 for preventing UV-rays from being permeated to the semiconductor layer 130 or an organic light emitting display element 190 during a fabricating process or after a fabricating process.

As illustrated in FIG. 2b, in an organic light emitting display 102 according to the present invention, the non-transmissive layer 210 and an anti-friction layer 230 is formed in sequence on the under surface of the substrate 110.

It is not described in the drawings, a transparent moisture absorption layer is further formed on the under surface of the encapsulation substrate 250. Since an organic light emitting diode 190 is vulnerable to moisture, it is possible to form the transparent moisture absorption layer on the under surface of the encapsulation substrate 250 which can absorb moisture without hindering the progress of the light. If the a transparent moisture absorption layer is getting thicker when the transparency of the encapsulation substrate 250 is secured, it is very useful, and it is preferable that the film having a thickness of 0.1~300 μm is formed If the thickness of the transparent moisture absorption layer is below 0.1 μm, the transparent moisture absorption layer does not have a sufficient moisture absorption characteristic, and if the thickness of the transparent moisture absorption layer is above 300 μm, the transparent moisture absorption layer is in a danger of contacting with the organic light emitting diode 190. The transparent moisture absorption layer is formed of at least one selected from, but not limited thereto, an alkali metal oxide, an alkaline-earth metal oxide, a metal halide, a metal sulfate and a metal perchlorate, a phosphorus pentoxide ($P_2O_5$) and their equivalents the average particle diameter of which is below 100 nm and, in particular, is from 20 nm to 100 nm.

As noted above, according to the present invention, any one selected from a layered inorganic substance, a high-polymer, a hardening agent and the equivalents thereof is filled between the substrate 110 and the encapsulant substrate 250 so that moisture is absorbed instead of forming the transparent moisture absorption layer on the encapsulant substrate 250. After the filling, a heat treatment process is executed to harden the material.

The present invention can also prevent the light reflection phenomenon of the external light by attaching a polarizer film on the surface of each encapsulant substrate 250.

Figure 3A:
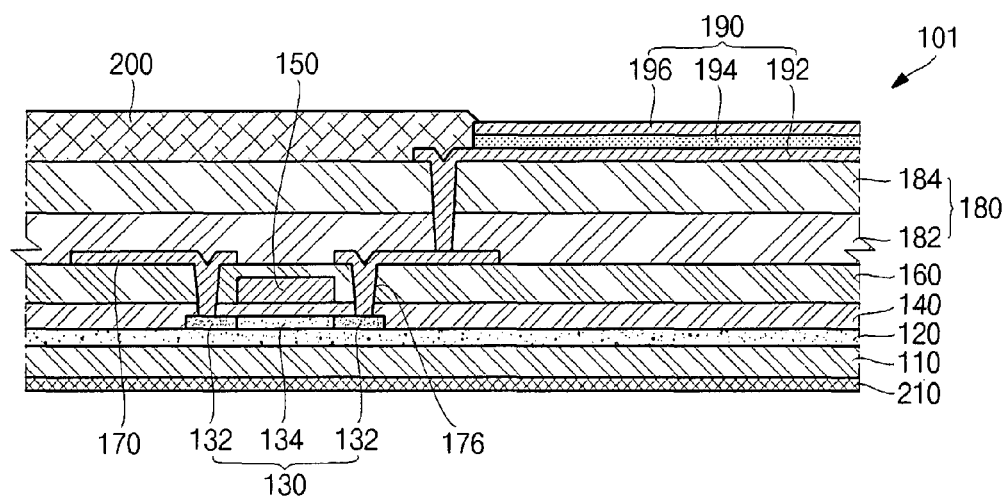
FIG. 3a and FIG. 3b are cross-sections of an organic light emitting display according to an embodiment of the present invention before an encapsulation substrate is formed.
Figure 3B:
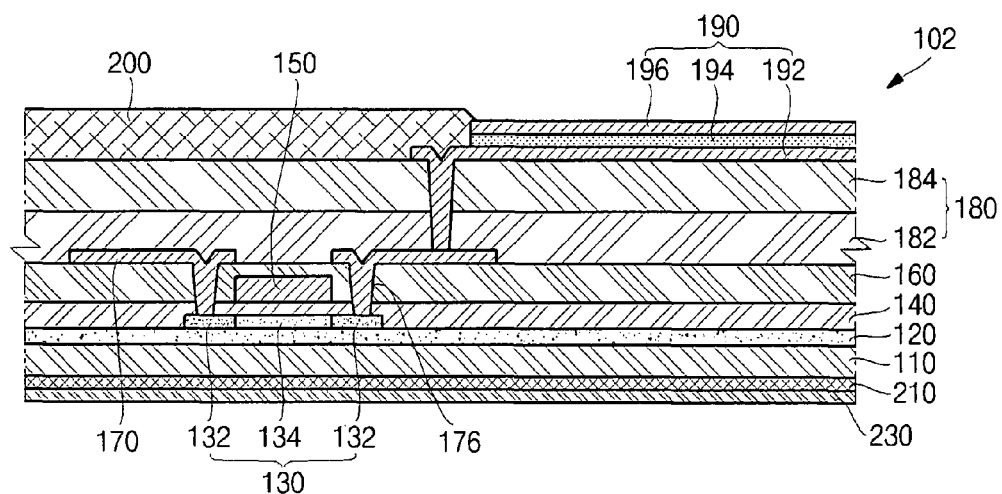

Referring to FIG. 3a and FIG. 3b, a cross section diagram an organic light emitting display according to the present invention before sealing an encapsulation substrate is described.

As illustrated in FIG. 3a, an organic light emitting display 101 according to the present invention can include a substrate 110, a buffer layer 120 formed on the substrate 110, a semiconductor layer 130 formed on the buffer layer 120, a gate insulating layer 140 formed on the semiconductor layer 130, a gate electrode 150 formed on the gate insulating layer 140, an inter-layer dielectric layer 160 formed on the gate electrode 150, a source/drain electrode 170 formed on the inter-layer dielectric layer 160, an insulating film 180 formed on the source/drain electrode 170, an organic light emitting diode 190 formed on the insulating film 180, and a pixel defining film 200 formed on the insulating film 180, which is the outer periphery of the organic light emitting diode 190.

The top surface and the under surface of the substrate 110 are approximately flat, and the top surface and the under surface having a thickness of about 0.05-1 mm is formed. If thickness of the substrate 110 is less than about 0.05 mm, it is damaged easily due to washing, etching, and a heat process during the fabricating processes, and is destroyed easily by external forces. If thickness of the substrate 110 is more than about 1 mm, it is difficult to apply it to various kinds of thin display devices. The substrate 110 is formed of a glass, a plastic, a polymer, a stainless steel or the equivalents thereof. However, the present invention is limited to these materials.

The buffer layer 120 having a constant thickness is formed on the top surface of the substrate 110. The buffer layer 120 prevents moisture ($H_2O$), hydrogen ($H_2$), or oxygen ($O_2$) and etc. from penetrating and permeating into the semiconductor layer 140 or the organic light emitting diode 190, which are described later, via the substrate 110. The buffer layer 120 is formed using a silicon dioxide film ($SiO_2$), a silicon nitrate film($Si_3N_4$), or the equivalents thereof which is easily fabricated during a semiconductor process. However, the present invention is not limited to these materials. This buffer layer 120 can also be omitted if necessary.

The semiconductor layer 130 is formed on the top surface of the buffer layer 120. Such a semiconductor layer 130 can include a source/drain region 132 formed on two opposing sides, and a channel region 134 formed between the source/drain region 132. As an example, the semiconductor layer 130 is a thin-film transistor. Such a thin-film transistor is an amorphous silicon thin-film transistor, a poly-silicon thin-film transistor, an organic thin layer transistor, a micro silicon thin-film transistor or the equivalents thereof. However, the present invention is not limited to these kinds of thin-film transistors. If the thin-film transistor is a poly-silicon thin-film transistor, it is crystallized by a crystallization method using a laser at a low temperature, a crystallization method using a metal, a crystallization method using a high pressure, or the equivalent methods. However, the present invention is not limited to these crystallization methods. Excimer Laser Annealing (ELA), Sequential Lateral Solidification (SLS), and Thin Beam Direction Crystallization (TDX) are examples of crystallizing methods using the laser. However, the present invention is not limited to these methods. Solid Phase Crystallization (SPC), Metal Induced Crystallization (MIC), Metal Induced Lateral Crystallization (MILC), and Super Grained Silicon (SGS) are examples of crystallization methods using a metal. However, the present invention is not limited to these crystallization methods. The thin-film transistor is a PMOS or NMOS transistor or the equivalents. However, the present invention is not limited to these types of thin-film transistors.

The gate insulating layer 140 is formed on the top surface of the semiconductor layer 130. The gate insulating layer 140 is formed on the buffer layer 120 which is the outer periphery of the semiconductor layer 130. The gate insulating layer 140 is formed using a silicon dioxide film, a silicon nitrate film, or the equivalents thereof which are easily obtained during a semiconductor process. However, the present invention is not limited to these materials.

The gate electrode 150 is formed on the top surface of the gate insulating layer 140. More specifically, the gate electrode 150 is formed on the gate insulating layer 140 corresponding to the channel region 134 of the semiconductor layer 130. This gate electrode 150 enables a channel of a hole or an electron to be formed on the channel region 134 by supplying an electric field to a channel region of the under surface of the gate insulating layer 140. The gate electrode 150 is formed of a common metal (Mo, MoW, Ti, Cu, Al, AlNd, Cr, Mo alloy, Cu alloy, Al alloy, etc.), or a doped poly-silicon or the equivalents thereof. However, the present invention is not limited to these materials.

The inter-layer dielectric layer 160 is formed on the top surface of the gate electrode 150. The inter-layer dielectric layer 160 can also be formed on the gate insulating layer 140 which is the outer periphery of the gate electrode 150. The inter-layer dielectric layer 160 is formed by a polymer system, a plastic system, a glass system, or the equivalent systems. However, the present invention is not limited to these materials.

The source/drain electrode 170 is formed on the top surface of the inter-layer dielectric layer 160. An electrically conductive contact 176 penetrating through the inter-layer dielectric layer 170 is formed between the source/drain electrode 170 and the semiconductor layer 130. The source/drain electrode 170 and the semiconductor layer 130 are electrically connected together by the electrically conductive contact 176. The source/drain electrode 170 is formed of the same material used to form the gate electrode 150. However, the present invention is not limited to this material. The semiconductor layer 130 (that is, a thin-film transistor) is generally defined as a coplanar structure. However, the semiconductor layer 130 of the present invention is not limited to the coplanar structure, and it is formed as at least one structure selected from the structures of all kinds of known thin-film transistors, for example, an inverted coplanar structure, a staggered structure, an inverted staggered structure or the equivalent structures. However, the present invention is not limited to these structures.

The insulating film 180 is formed on the top surface of the source/drain electrode 170. The insulating film 180 can include a protection layer 182 and a planarization layer 184 formed on the top surface of the protection layer 182. The protection layer 182 covers the source/drain electrode 170 and the inter-layer dielectric layer 160, and protects the source/drain electrode 170 and the inter-layer dielectric layer 160. The protection layer 182 is formed of an inorganic film or the equivalents thereof. However, the present invention is not limited to this material. Moreover, the planarization layer 184 covers the protection layer 182. The planarization layer 184 flattens the entire surface of an element, and is formed by coating or depositing Benzo Cyclo Butene (BCB), acryl, or the equivalents thereof. However, the present invention is not limited to these materials or formation methods of the planarization layer 184.

The organic light emitting diode 190 is formed on the top surface of the insulating film 180. The organic light emitting diode 190 includes an anode 192, an organic thin layer 194 formed on the top surface of the anode 192, and a cathode 196 on the top surface of the organic thin layer 194. The anode 192 is formed of Indium Tin Oxide (ITO), Indium Tin Oxide (ITO)/Ag, Indium Tin Oxide (ITO)/Ag/ITO(IZO: Indium Zinc Oxide) or the equivalents thereof. However, the present invention is not limited to these materials or formation methods of the anode 192. The ITO is a transparent conductive layer in which a work function is uniform and a hole injecting barrier to the organic light emitting thin layer 194 is small, and the Ag is a layer that reflects the light emitted from the organic light emitting thin layer 194 to the top surface in a top emission system. The organic light emitting thin layer 194 includes an EML that emits light by joining the electrons with the holes and forming excitons, an ETL that adjusts the moving velocity of the electron, and an HTL that adjusts the moving velocity of the hole. Moreover, an EIL for improving the injection efficiency of the electrons is formed on the ETL and an HIL for improving the injection efficiency of the holes is further formed on the HTL. Furthermore, the cathode 196 is formed of Al, MgAg alloy, MgCa alloy or their equivalents. However, the present invention is not limited thereto. If the top emission system is employed in the present invention, then the thickness of the Al must be very thin. However, in such a case, the resistance becomes high, and thus the electron injecting barrier becomes large. The MgAg alloy has an electron injecting barrier that is smaller than that of the Al, and the MgCa alloy has an electron injecting barrier that is smaller than that of the MgAg Alloy. However, the MgAg alloy and the MgCa alloy must be completely protected from the outside because they are sensitive to the surrounding environment and can oxidize and form an insulating layer. Moreover, the anode 192 of the organic light emitting diode 190 and the source/drain electrode 170 are electrically interconnected by an electrically conductive via 198 penetrating through the insulating layer 180 (the protective layer 182 and the planarization layer 184). Although the present invention has been described based on a top emission system in which the light is emitted in the direction of the upper part of the substrate 110, the present invention can also be applied to a bottom emission system in which the light is emitted in the direction of the lower part of the substrate 110 or a dual emission system in which the light is simultaneously emitted in the directions of the upper and lower parts of the substrate 110.

In a case of phosphorescent organic light emitting diode, a Hole Blocking Layer (HBL) is selectively formed between the EML and the ETL, and the EBL is selectively formed between the EML and the HTL.

The organic thin layer 194 can also be a thin OLED which further reduces the thickness by mixing two kinds of layers. For example, a Hole Injection Transport Layer (HITL) structure which forms the HIL and the HTL at the same time, and an Electron Injection Transport Layer (EITL) structure which forms the EIL and the ETL at the same time are selectively formed. The thin OLED is used for increasing the light-emitting efficiency.

A buffer layer as a selection layer is formed between the anode and the emitting layer. The buffer layer is classified into an electron buffer layer for buffering the electrons, and a hole buffer layer for buffering the holes. The electron buffer layer is selectively formed between the cathode and the EIL, and is formed instead of the functions of the EIL. The stack structure of the organic thin layer 194 can include the EML/ETL/electron buffer layer/cathode. Furthermore, the hole buffer layer is selectively formed between the anode and the HIL, and is formed instead of the functions of the HIL. The stack structure of the organic thin layer 194 can include the anode/hole buffer layer/hole transport layer/ETL/EML.

In connection with above structure, the stacked structures which is obtained are as follows.

a) Normal Stack Structure 1) an anode/a hole injection layer/a hole transport layer/a light emitting layer/an electron transport layer/an electron injection layer/a cathode.

2) an anode/a hole buffer layer/a hole injection layer/a hole transport layer/a light emitting layer/an electron transport layer/an electron injection layer/a cathode.

3) an anode/a hole injection layer/a hole transport layer/a light emitting layer/an electron transport layer/an electron injection layer/an electron buffer layer/a cathode.

4) an anode/a hole buffer layer/a hole injection layer/a hole transport layer/a light emitting layer/an electron transport layer/an electron injection layer/an electron buffer layer/a cathode.

5) an anode/a hole injection layer/a hole buffer layer/a hole transport layer/a light emitting layer/an electron transport layer/an electron injection layer/a cathode.

6) an anode/a hole injection layer/a hole transport layer/a light emitting layer/an electron transport layer/an electron buffer layer/an electron injection layer/a cathode.

b) Normal Thin Structure 1) an anode/a hole injection and transport layer/a light emitting layer/an electron transport layer/an electron injection layer/a cathode.

2) an anode/a hole buffer layer/a hole injection and transport layer/a light emitting layer/an electron transport layer/an electron injection layer/a cathode.

3) an anode/a hole injection layer/a hole transport layer/a light emitting layer/an electron injection layer/an electron buffer layer/a cathode.

4) an anode/a hole buffer layer/a hole transport layer/a light emitting layer/an electron injection and transport layer/an electron buffer layer/a cathode.

5) an anode/a hole injection and transport layer/a hole buffer layer/a light emitting layer/an electron transport layer/an electron injection layer/a cathode.

6) an anode/a hole injection layer/a hole transport layer/a light emitting layer/an electron buffer layer/an electron injection and transport layer/a cathode.

c) Inverted Stack Structure 1) a cathode/an electron injection layer/an electron transport layer/a light emitting layer/a hole transport layer/a hole injection layer/an anode.

2) a cathode/an electron injection layer/an electron transport layer/a light emitting layer/a hole transport layer/a hole injection layer/a hole buffer layer/an anode.

3) a cathode/an electron buffer layer/an electron injection layer/an electron transport layer/a light emitting layer/a hole transport layer/a hole injection layer/an anode.

4) a cathode/an electron buffer layer/an electron injection layer/an electron transport layer/a light emitting layer/a hole transport layer/a hole injection layer/an anode.

5) a cathode/an electron injection layer/an electron transport layer/a light emitting layer/a hole transport layer/a hole buffer layer/a hole injection layer/an anode.

6) a cathode/an electron injection layer/an electron buffer layer/an electron transport layer/a light emitting layer/a hole transport layer/a hole injection layer/an anode.

d) Inverted Thin Structure 1) a cathode/an electron injection layer/an electron transport layer/a light emitting layer/a hole injection and transport layer/an anode.

2) a cathode/an electron injection layer/an electron transport layer/a light emitting layer/a hole injection and transport layer/a hole buffer layer/an anode.

3) a cathode/an electron buffer layer/an electron injection and transport layer/a light emitting layer/a hole transport layer/a hole injection layer/an anode.

4) a cathode/an electron buffer layer/an electron injection and transport layer/a light emitting layer/a hole transport layer/a hole buffer layer/an anode.

5) a cathode/an electron injection layer/an electron transport layer/a light emitting layer/a hole buffer layer/a hole injection and transport layer/an anode.

6) a cathode/an electron injection and transport layer/an electron buffer layer/a light emitting layer/a hole transport layer/a hole injection layer/an anode.

The pixel defining layer 200 is an outer periphery of the organic light emitting diode 190, and is formed on the top surface of the insulating layer 180. Such a pixel defining layer 200 clearly defines the boundaries among a red organic light emitting diode, a green organic light emitting diode, and a blue organic light emitting diode. Such a pixel defining layer 200 is formed of a polyimide or equivalents thereof. However, the materials of the pixel defining layer 200 are not limited.

The non-transmissive layer 210 is further formed on the top surface ofthe substrate 110. Such a non-transmissive layer 210 prevents the UV-rays from impinging on the other opposing substrate during a fabricating process of the semiconductor layer 130 or an organic light emitting display element 190 by attaching two substrates. After the substrate 110 is separated individually, the non-transmissive layer 210 also prevents the external UV-rays from being impinging upon the semiconductor layer 130 or an organic light emitting display element 190. The non-transmissive layer 210 is formed in sequence of a UV-ray protective agent or equivalents thereof. The non-transmissive layer 210 is formed of a metal into which a UV-rays can not penetrate, a transparent UV-ray protective agent, an opaque UV-ray protective agent, or the equivalents thereof. If the non-transmissive layer 210 is a metal, it is formed of Cr, $Cr_2O_3$, Al, Au, Ag, MgO, silver alloy, or the equivalents thereof, However, the present invention is not limited to these materials. It is preferable that the non-transmissive layer 210 having a thickness of about 500 Å to 3,000 Å is formed. If the thickness of the non-transmissive layer 210 is less than 500 Å, the blocking rate of the UV-rays is low, it can affect the semiconductor layer 130 or an organic light emitting display element 190 during a fabricating process or after a fabricating process, and if the thickness of the non-transmissive layer 210 is more than 3000 Å, even though sufficient blocking efficiency in blocking the UV-rays is obtained, it becomes excessively thick.

As illustrated in FIG. 3b, an organic light emitting display 102 according to the present invention can further include an anti-friction layer 230 on the under surface of the non-transmissive layer 210. Such an anti-friction layer 230 prevents two substrates from being contacted during the process of forming the semiconductor layer 130, the organic light emitting diodes 190, and etc. by bonding two substrates 110. Such an anti-friction layer 230 is formed from an organic material, inorganic material or the equivalents thereof. However, the materials of the anti-friction layer 220 are not limited thereto. It is preferable that the anti-friction layer 230 have a thickness of 10-100 μm. If the thickness of the anti-friction layer 230 is less than 10 μm, it can contact the non-transmissive layer 210 formed on the other substrate 110 during the fabricating processes, and if the thickness of the anti-friction layer 230 is more than 100 μm, the substrate 110 becomes excessively thick.

Figure 4:
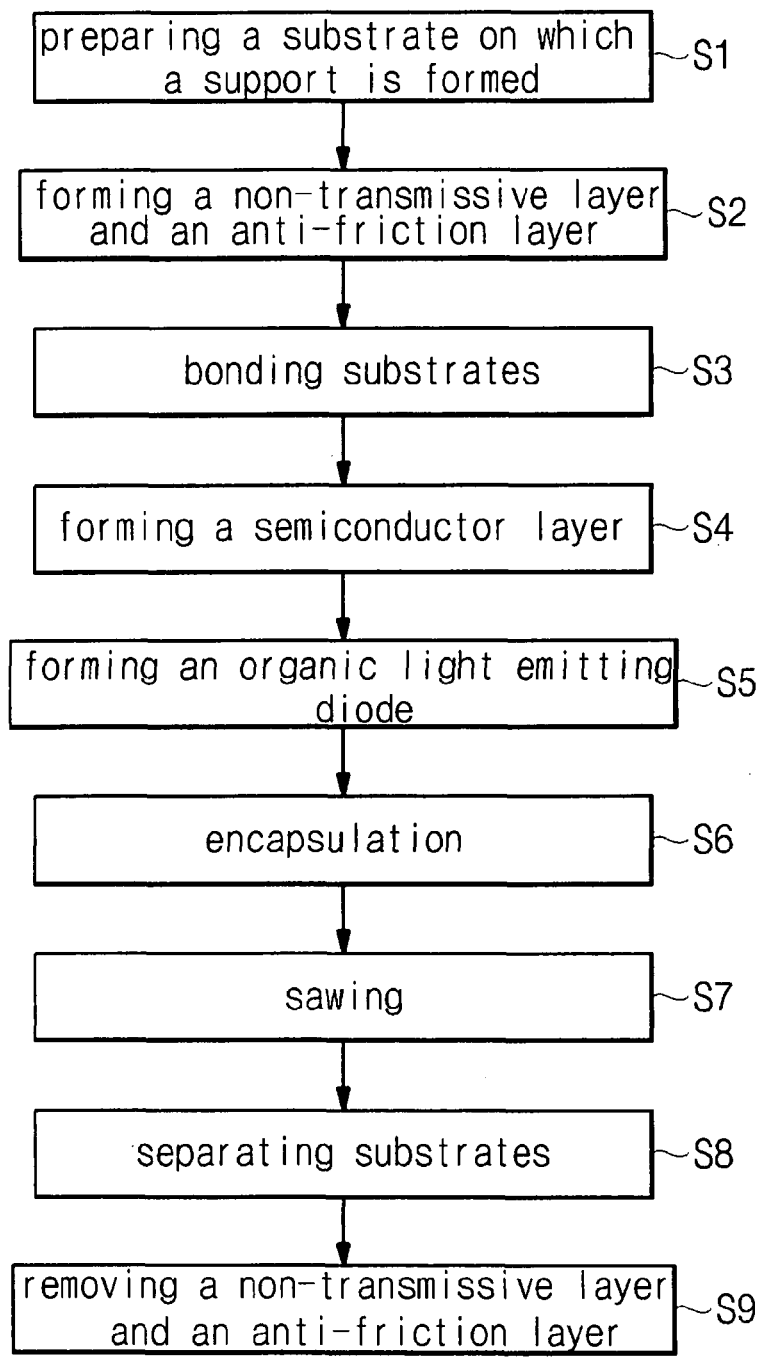
FIG. 4 is a flowchart of a method of fabricating an organic light emitting display according to an embodiment of the present invention.

FIG. 4 is a flowchart of a method of fabricating the organic light emitting display according to an embodiment of the present invention.

As illustrated in FIG. 4, a method of fabricating the organic light emitting display according to an embodiment of the present invention includes a step S1 of preparing a substrate, a step S2 of forming a non-transmissive layer, a step of S3 of bonding two prepared substrates, a step S4 of forming a semiconductor layer, a step S5 of forming an organic light emitting diode, an encapsulation step S6, and a sawing step S7 and a step S8 of separating the substrates. In the present invention, a step S9 of removing the non-transmissive layer is further included.

Referring to FIG. 5a-FIG. 5i, a method of fabricating the organic light emitting display according to an embodiment of the present invention is illustrated as cross-sections.

Figure 5A:
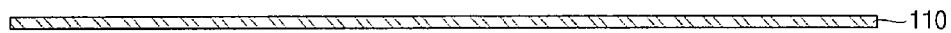
FIG. 5a-FIG. 5i are views of a procedure of a method of fabricating an organic light emitting display according to an embodiment of the present invention.

As illustrated in FIG. 5a, at the step S1 of preparing a substrate, the top surface and the under surface are almost flattened, and a substrate 110 having a constant thickness is provided.

It is preferable that the substrate 110 has the thickness of approximately 0.05-1 mm. If the thickness of the substrate 110 is less than about 0.05 mm, it is easily damaged due to washing, etching, and heat processes during the fabricating processes, it becomes difficult to handle, and is easily destroyed due to external forces. If the thickness of the substrate 110 is more than about 1 mm, it is difficult to apply it to various kinds of display devices which are getting thinner. The substrate 110 is formed of a glass, a plastic, a polymer or the equivalents thereof. However, the present invention is not limited to these materials and kinds of substrates 110.

A support 112 having a constant thickness is further formed on the substrate 110 in order to prevent bending of the substrate 112 during a fabricating process or after a fabricating process. In particular, since bending of the substrate 110 is prevented during a fabricating process by the support 110, the driving circuit 139, the semiconductor layer 130, and the organic light emitting diode 190 is formed precisely without inferior quality. The support 112 remains in the substrate 110 even after completion of a fabricating process, and thus the rigidity of a product is improved. This support 112 is formed on the outer periphery of the driving circuit 139, the semiconductor layer 130, and the encapsulant 240, and the support is formed in the vicinity of at least one side of the substrate 110. If the plane shape of the substrate 110 is a quadrangle, the support 112 is in the vicinity of one side, two sides, three sides or four sides of the substrate 110. The support 112 is thinner than the encapsulant 240, or the entire thickness of the encapsulant 240 and the encapsulation substrate 250 to provide a thin organic light emitting display. Moreover, the support 112 is formed of an insulating material, a conductive material, or the equivalents thereof. However, the present invention is not limited to these materials. For example, the support 112 can be formed of a reinforced plastic or a stainless steel. Such a support 112 is attached to the substrate 110 by a bonding agent which is not illustrated. The support 112 can formed of the same material as that of the substrate 110, thereby making it possible to form the support 112 simultaneously with the substrate 110.

Figure 5B:
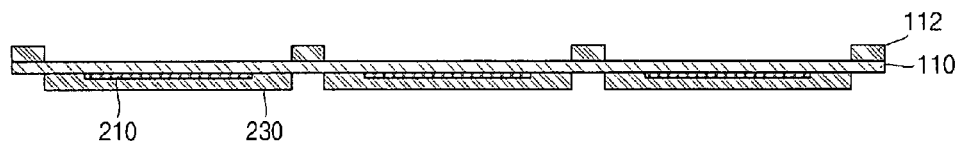

As illustrated in FIG. 5b, at the step S2 for forming non-transmissive layer, a non-transmissive layer 210 having a predetermined thickness is formed on the under surface of the substrate 110.

Such a non-transmissive layer 210 prevents the UV-rays from impinging upon the other opposing substrate during a fabricating process of the semiconductor layer or an organic light emitting display element by bonding two substrates. After the substrate 110 is separated individually, the non-transmissive layer 210 also prevents the external UV-rays from impinging upon the semiconductor layer or an organic light emitting display element. The non-transmissive layer 210 is formed in sequence by coating the surface of the substrate with a UV-ray protective agent or an equivalent thereof. The non-transmissive layer 210 is formed by coating the surface of the substrate with a metal into which a UV-rays can not penetrate, a transparent UV-ray protective agent, an opaque UV-ray protective agent, or the equivalents thereof, or by depositing them on the surface of the substrate. If the non-transmissive layer 210 is a metal, it is formed by coating the surface of the substrate with Cr, $Cr_2O_3$, Al, Au, Ag, MgO, silver alloy, or the equivalents thereof, or by depositing them on the surface of the substrate. It is preferable that the non-transmissive layer 210 have a thickness of about 500 Å to 3,000 Å. If the thickness of the non-transmissive layer 210 is less than 500 Å, the blocking of the UV-rays is low, so that it can affect the semiconductor layer 130 or an organic light emitting display element 190 during a fabricating process or after a fabricating process, and if the thickness ofthe non-transmissive layer 210 is more than 3000 Å, even though sufficient blocking of the UV-rays is obtained, it becomes excessively thick.

At the step S2 of forming non-transmissive layer, an anti-friction layer 230 is further formed on the under surface of the non-transmissive layer 210. The anti-friction layer 230 prevents two substrates from being contacted during the process for forming the semiconductor layer, the organic light emitting diodes, etc. by bonding two substrates 110. Damage of the substrate 110 is prevented by allowing the non-transmissive layer 210 formed on both substrates 110 not to be in contact with each other. Such an anti-friction layer 230 is formed of an organic material, an inorganic material or the equivalents thereof. However, the materials of the anti-friction layer 220 are not limited thereto. It is preferable that the anti-friction layer 230 have a thickness of 10-100 μm. If the thickness of the anti-friction layer 230 is less than 10 μm, it is highly probable that it can contact the non-transmissive layer 210 formed on the other substrate 110 during the fabricating processes and if the thickness of the anti-friction layer 230 is more than 100 μm, the substrate 110 becomes excessively thick.

Figure 5C:
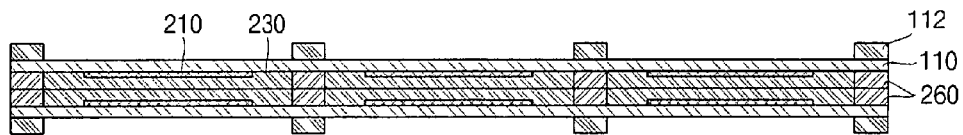

As illustrated in FIG. 5c, at the step S3 of bonding two substrates, two same substrates 110 which one of the non-transmissive layer 210, or the non-transmissive layer 210/the anti-friction layer 220 are prepared and are bonded together. In FIG. 5c, the sequential flow for forming the non-transmissive layer 210/the anti-friction layer 220 is illustrated.

A bonding agent 260 is inserted between two substrates so that the two substrates can not be separated. An epoxy adhesive, a UV-ray setting adhesive, or the equivalents thereof are employed as the bonding agent 260. However, the present invention is not limited to these materials of the bonding agent 260. The bonding agent 260 is formed on the periphery of the substrate 110, or is formed on the inner periphery of both substrates 110 as a plurality of lines for more stable adhesion of the substrate 110. In FIG. 5c, a structure is illustrated in which a plurality of bonding agents 260 is formed between two substrates 110.

The bonding agent 260 is formed to face the support 112 centering on the substrate 110 in the drawings. However, the present invention is not limited to such an opposing position.

The support 112 and the bonding agent 260 can also be respectively formed on the positions which they do not face each other.

The anti-friction layer 230 can also be formed at the step S3 of bonding two substrates 110 as well as the step S2 of forming the non-transmissive layer 210. If the anti-friction layer 220 of a liquid type is injected into the substrates after bonding two substrates 110 by inserting an bonding agent 260, all of it seeps into a gap between formed between two substrates 110 due to a capillary phenomenon. It is preferable that the anti-friction layer 230 is hardened by applying a heat treatment to the substrate 110 at a predetermined temperature after the anti-friction layer 230 in a liquid type is formed. It is preferable that the anti-friction layers 230 formed on two substrates 110 are in contact with each other tightly for preventing bending and friction of the substrate 110.

Figure 5D:
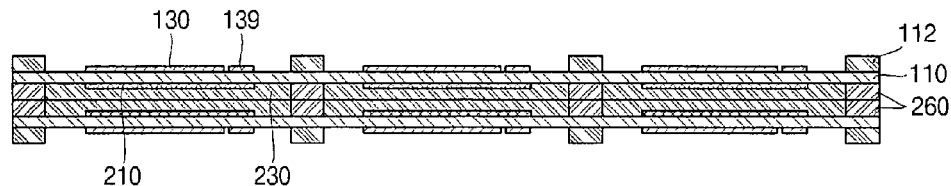

As illustrated in FIG. 5d, at the step S4 of forming the semiconductor layer, the semiconductor layer is formed on the surface of two bonded substrates 110. A driving circuit 139 can also be formed on one side of the semiconductor layer 130. To be more specific, the semiconductor layer 130 is formed on the surface of two bonded substrates 110 which is an opposite side of the side which the anti-friction layers 230 is formed for driving the organic light emitting display. A driving circuit 139 can also be formed on one side of the semiconductor layer 130. It is possible to form a buffer layer (not illustrated) on the surface of the substrate 110 in advance before forming the driving circuit 139 or the semiconductor layer 130. After forming the semiconductor layer 130, a gate insulating layer, a gate electrode, an interlayer insulating layer, a source/drain electrode, an insulating layer(not illustrated) and so on are formed. Explanations related to these elements have been described sufficiently in the preceding sections, and thus explanations about them have been omitted. It is possible to form a pixel defining layer after forming the insulating layer.

After the driving circuit 139 and the semiconductor layer 130 are formed on one substrate, they is formed on the other substrate. After the driving circuit 139 and the semiconductor layer 130 are formed on one substrate, it is possible to form the driving circuit 139 and the semiconductor layer 130 on the other substrate once again. The semiconductor layer 130 and the driving circuit 139 is formed by turning over one substrate and the other substrate according to the sequence of the processes. If the process equipment is available, the semiconductor layer 130 and the driving circuit 139 are simultaneously formed on both substrates.

Figure 5E:
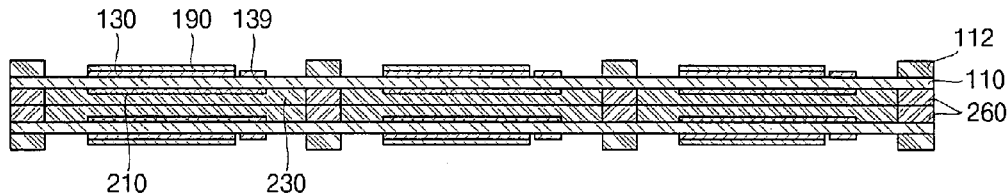

As illustrated in FIG. 5e, at the step S5 of forming an organic light emitting diode, the organic light emitting diode 190 is formed on the top surface of the semiconductor layer 130. To be more specific, as noted above, the anode and the organic thin layer, and the cathode are formed on the insulating layer (not illustrated). The structure of the organic light emitting diode 190 and the method for forming it have already been explained, and an explanation related to it has been omitted.

Likewise, after the organic light emitting diode 190 is formed on one substrate, it is possible to form the organic light emitting diode 190 on the other substrate. It is possible to form the organic light emitting diode 190 on one substrate, and then to form the organic light emitting diode 190 on the other substrate. The organic light emitting diode 190 is formed by turning over one side substrate and the other side substrate according to the sequence of the processes. If the process equipment is available, the organic light emitting diode 190 is simultaneously formed on both substrates.

Figure 5F:
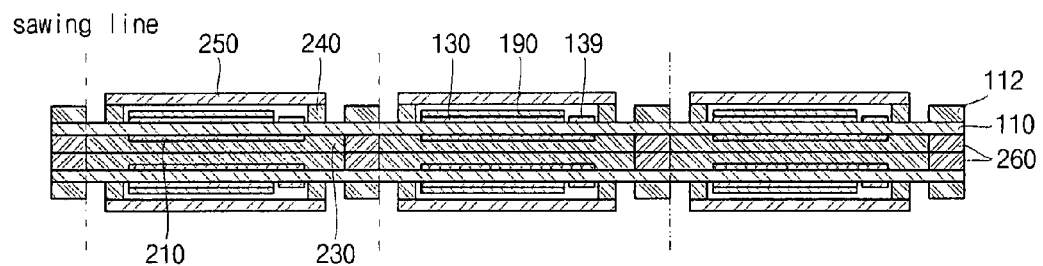

As illustrated in FIG. 5f, at the step S6 of bonding the encapsulation substrate, the encapsulation substrate 240 is attached to the side which the organic light emitting diode 190 and the semiconductor layer 130 are formed using the encapsulant 230. The encapsulation substrate 240 is formed of a transparent glass, a transparent plastic, a transparent polymer or the equivalents thereof. However, the present invention is not limited to these materials of the encapsulation substrate 240. It is preferable that the encapsulation substrate 240 having the area smaller than the area formed by the bonding agent 260 is used. To be more specific, it is possible to perform sawing of the edge of the substrate 110 easily by forming the edge of the encapsulation substrate 240 smaller by about 3-8 mm in the inside direction from the bonding agent 260. However, the lengths of the encapsulation substrate 240 and the bonding agent 260 are not limited. The encapsulant 230 is an epoxy adhesive, a UV-ray setting adhesive, a frit or the equivalents thereof. However, the materials thereof are not limited thereto. If a frit is used as the encapsulant 230, since it is necessary to heat the frit at a predetermined temperature, an encapsulation process is executed by using a laser beam.

In the drawings, though an encapsulation process is executed using the encapsulation substrate 240 for every region which the driving circuit 139, the organic light emitting diode 190 and each semiconductor layer 130 are formed, it is possible to reduce the complexity of the processes by performing the above processes.

Though not illustrated, the present invention can further use a transparent moisture absorption layer formed on the under surface of the encapsulation substrate 240. Since an organic light emitting diode 190 is vulnerable to moisture, it is possible to form the transparent moisture absorption layer on the under surface of the encapsulation substrate 250 which can absorb moisture without hindering the progress of the light. If such a transparent moisture absorption layer is getting thicker when the transparency of the encapsulation substrate 240 is secured, it is very useful, and it is preferable that the film having a thickness of 0.1~300 μm is formed If the thickness of the transparent moisture absorption layer is below 0.1 μm, the transparent moisture absorption layer does not have a sufficient moisture absorption characteristic, and if the thickness of the transparent moisture absorption layer is above 300 μm, the transparent moisture absorption layer is in a danger of contacting with the organic light emitting diode 190. The transparent moisture absorption layer is formed of an alkali metal oxide, an alkaline earth metal oxide, a metal halide, a metal sulfate, and a metal perchlorate, a phosphorus($P_2O_5$) or the equivalents thereof having an average particle diameter of 100 nm. More particularly, an average particle diameter of 20-100 nm. However, the present invention is not limited to these materials.

Further, as noted above, according to the present invention, an encapsulation process is completed by allowing a layered inorganic substance, a high-polymer, a hardening agent or the equivalents thereof to be filled between the substrate 110 and the encapsulant 240 instead of forming the transparent moisture absorption layer on the encapsulation substrate 240. Of course, after such a filling, a heat treatment process is executed, and thus the above-mentioned materials are cured.

According to the present invention, it is natural that the reflection phenomenon of the external light is improved by attaching a polarizing film on the surface of every encapsulation substrate 240.

Figure 5G:
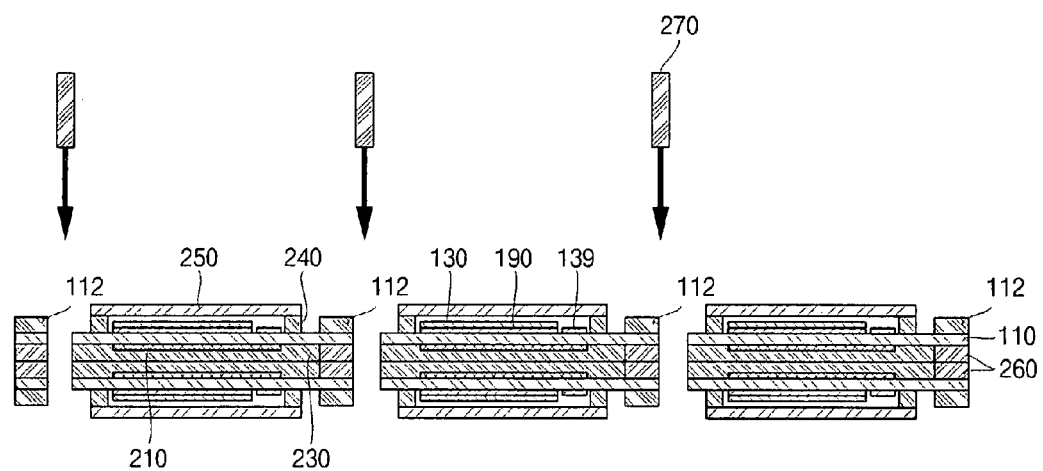

As illustrated in FIG. 5g, at the sawing step S7, a sawing process is applied to the substrate 110 so that it is separated into a unit organic light emitting display. It is possible to apply a sawing process to the substrate 110 arranged on the outer periphery of the semiconductor layer 130, the driving circuit 139, and the organic light emitting diode 190. The sawing process is executed by a diamond wheel, a laser beam, or the equivalent methods. However, the present invention is not limited to these sawing methods. In the drawings, the symbol 270 which is not explained is a laser beam emitting device.

The sawing process is executed so that the support 112 and the bonding agent 260 can remain on at least one side of the substrate 110 during the sawing process. In FIG. 5g, the sawing process is executed so that both the support 112 and the bonding agent 260 remain on the right end of the substrate 110. In this way, the support 112 and the bonding agent 260 remaining in the substrate 110 performs a function to secure the rigidity of the substrate 110 during many processes.

Figure 5H:
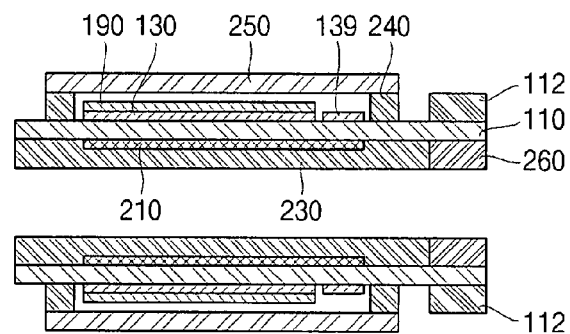

As illustrated in FIG. 5h, at the step S8 of separating two substrates, two substrates 110 to which a sawing process is applied are separated individually. The non-transmissive layer 219 and the non-transmissive layer 219/the anti-friction layer 230 as well as the support 112 and the bonding agent 260 remain on the separated substrate 110. In the drawings, the non-transmissive layer 219/the anti-friction layer 230 remains on the under surface of the substrate 110.

If the anti-friction layer 230 is formed on every substrate 110 individually before the step of bonding two substrates, separation of every substrate 110 is easily executed. However, if the anti-friction layer 230 of a liquid type is injected after bonding two substrates, the separation of every substrate 110 can not be easily executed. The anti-friction layer 230 is eliminated by using a chemical solution which can dissolve the anti-friction layer 230. It is preferable that the anti-friction layer 230 is formed by an organic material which is dissolved in the chemical solution for this purpose.

According to the present invention, the process is ended with designating the step of separating two substrates 110 as a final step. After the step of separating two substrates 110, the display device is marketed as a product after passing through a cell test, Flexible Printed Circuit (FPC) bonding, a module test, and a reliability test. The cell test is executed before the sawing step by creating an additional region on the substrate.

If the step of separating two substrates 110 is employed as a final process as described above, the non-transmissive layer 219 and the non-transmissive layer 219/the anti-friction layer 230 as well as the support 112 and the bonding agent 260 can remain on the organic light emitting display.

Figure 5I:
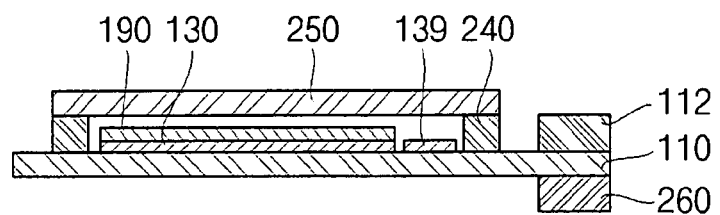

As illustrated in FIG. 5i, at the step S9 of removing the non-transmissive layer 219, the non-transmissive layer 219 is removed by etching or grinding process. To be more specific, if only the non-transmissive layer 219 remains on the under surface of the substrate 110, the non-transmissive layer 219 is removed. If the non-transmissive layer 219/the anti-friction layer 230 remain on the under surface of the substrate 110, only the anti-friction layer 230 is removed or both of the non-transmissive layer 219/the anti-friction layer is removed. Even after the non-transmissive layer 219 and so on are removed, since the support 112 and the bonding agent 260 remain one side of the substrate 110, the rigidity of the substrate 110 is improved.

FIG. 6a-FIG. 6d illustrate a plane diagram of the shape of various kinds of the supports formed on a substrate of an organic light emitting display according to the present invention.

As illustrated in the drawings, the organic light emitting diode 240 and the driving circuit 139 are arranged in a matrix on the substrate 110. Both the organic light emitting diode 240 and the driving circuit 139 are defined as a unit. 33 units are arranged in the drawings. However, the present invention is not limited to 33 units. The support 112 is formed on the top surface of the substrate 110 in order to prevent bending during a fabricating process or after a fabricating process.

Figure 6A:
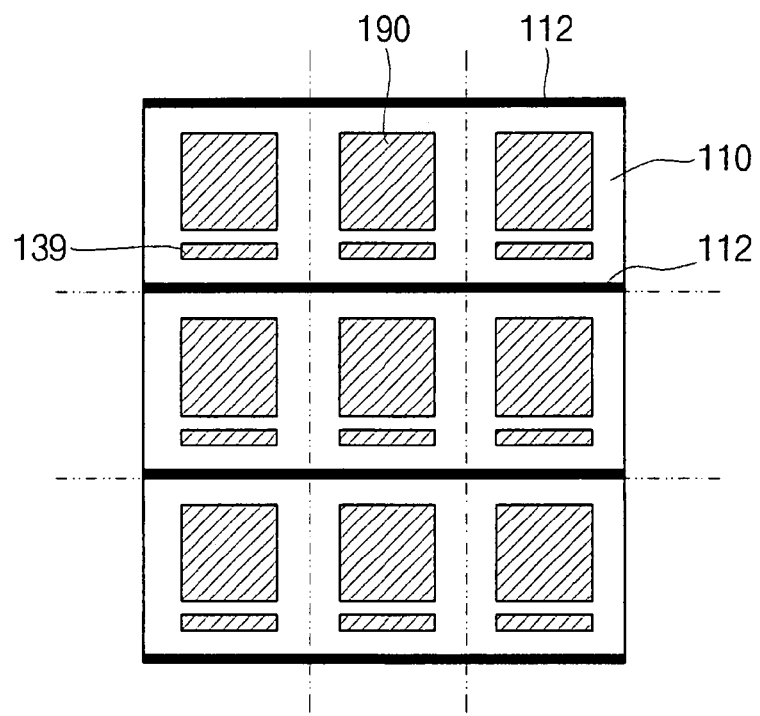
FIG. 6a-FIG. 6d are plane diagrams of the shape of various kinds of supports formed on a substrate of an organic light emitting display according to an embodiment of the present invention.
Figure 6B:
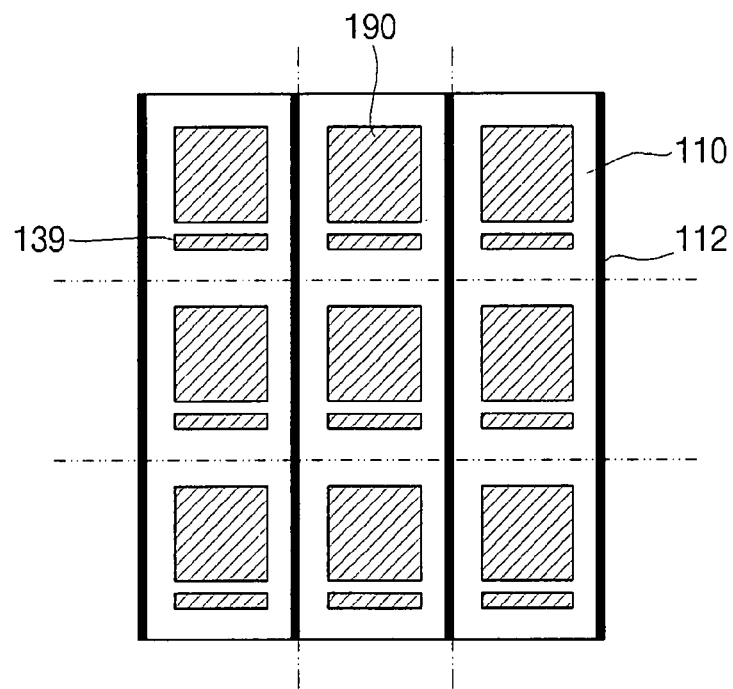
Figure 6C:
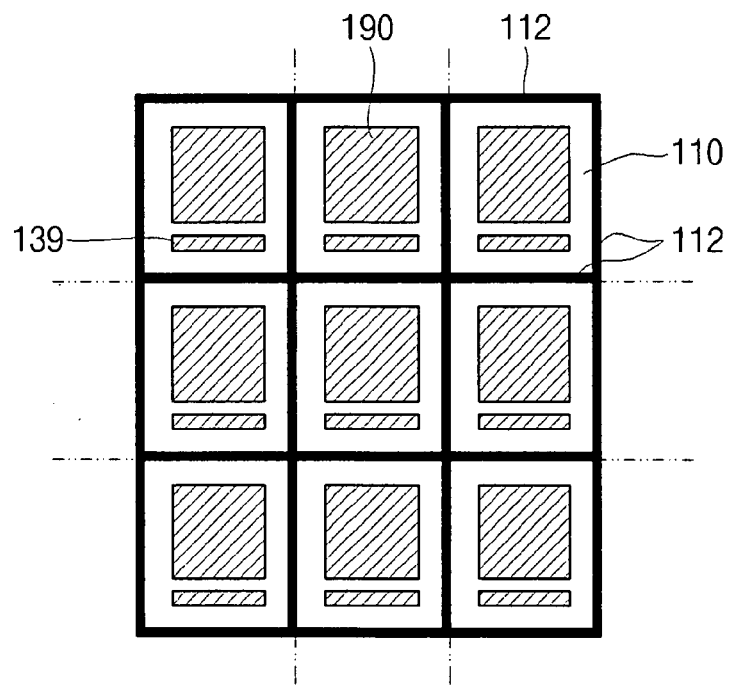
Figure 6D:
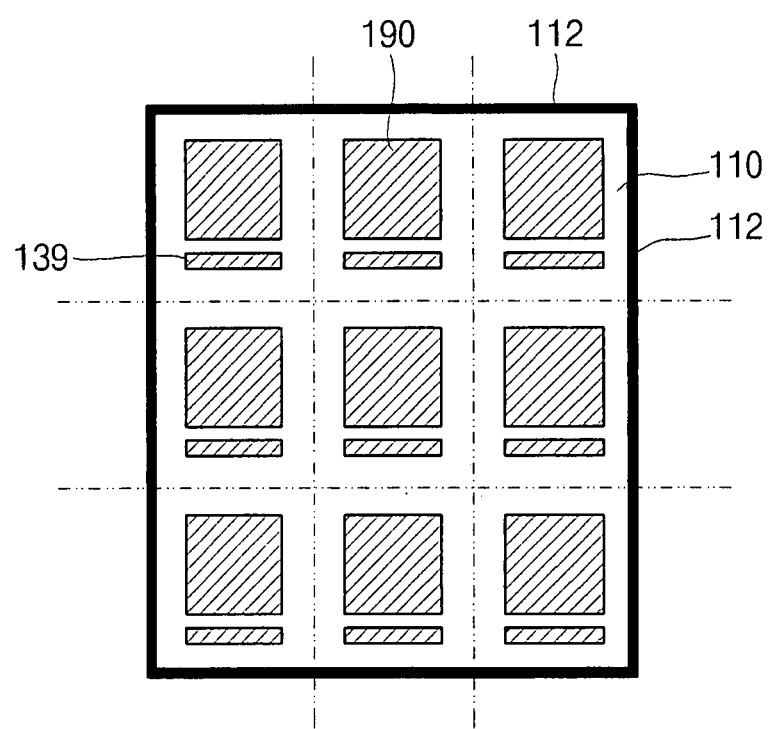

As illustrated in FIG. 6a, the support 112 is formed as the lines of a horizontal direction. As illustrated in FIG. 6b, the support 112 is formed as the lines of a vertical direction. As illustrated in FIG. 6c, the support 112 is formed as combination (that is, a checkered shape) of the lines of a vertical direction and the lines of a horizontal direction. As illustrated in FIG. 6d, the support 112 is formed as a quadrangle line shape along four sides of the substrate 110.

Two-dot chain line of the drawings means a sawing line. As illustrated in the drawings, the sawing line is formed as a checkered line shape. The support 112 is formed in the vertical direction, the horizontal direction, or is formed in the vertical direction and the horizontal direction simultaneously along one side of the sawing line.

Therefore, as described above, if a sawing process is executed along the sawing line, the support 112 having a predetermined thickness remain on the end portion of one side of the substrate 110. According to the formation position of the substrate 110, the position of the support 112 which will remain on the substrate 110 will be changed While the width of the support 112 is formed as being somewhat larger than that of the sawing diversely, if the support 112 is formed along the entire sawing line, the support 112 can remain on all peripheries (a quadrangle periphery) of the substrate 110 to which a sawing process is applied.

As described above, the support 112 prevents the organic light emitting display from being damaged or destroyed by reinforcing the rigidity during the remaining processes of the organic light emitting display or while the device is being used.

Since the organic light emitting display according to embodiments of the present invention formed as above is formed on the substrate having the thickness of 0.05-1 mm, it can applied to cellular telephones, PDAs, notebooks, computer monitors, and televisions and so on which are getting thinner.

As noted above, in an organic light emitting display according to embodiments of the present invention, since the non-transmissive layer is formed on the substrate, UV-rays do not affect a semiconductor layer or an organic light emitting display element while the products are being used.

As noted above, in an organic light emitting display according to embodiments of the present invention, since the support or an bonding agent remains on one side of the substrate, the rigidity of a product is enhanced and thus the device can not be easily damaged by external forces.

As noted above, in an organic light emitting display according to embodiments of the present invention, since the semiconductor processes and the organic thin layer processes (washing, etching, exposure, and a heat process are included in every fabricating process) is performed simultaneously after attaching two thin-type substrates having a thickness of 0.05-1 mm, the entire process time is shortened by 50%, and the substrate is protected from bending or damage during a transfer process of the substrate by reinforcing the rigidity.

As noted above, in the method for fabricating an organic light emitting display according to embodiments of the present invention, since a support is formed on one side of a substrate in advance, substrate bending and damage is prevented during a fabricating process. The processes related to a semiconductor layer and an organic thin layer are executed excellently without any inferior quality during a fabricating process.

As noted above, in the method for fabricating an organic light emitting display according to embodiments of the present invention, since a non-transmissive layer is formed on the under surface of the substrate, the UV-rays generated due to the exposure process does not affect another opposing substrate during a fabricating process.

As noted above, in the method for fabricating an organic light emitting display according to embodiments of the present invention, since a friction layer is formed on a substrate, when bonding two substrates, damage of the substrate is prevented by blocking a contact with a metal formed on the substrate or the surface of the substrate.

The embodiments explained above are only exemplary embodiments for realizing an organic light emitting display according to the present invention, and the method thereof, and it is to be noted that the present invention is not limited thereto, and various modifications can be realized by a person skilled in the art to which the present invention belongs without deviating from the scope of the present invention, which is recited in the claims below within the spirit of the present invention.

What is claimed is:

1. An organic light emitting display device, comprising:
   a substrate;
   a support arranged on one side of said substrate, said support is stainless steel;
   a bonding agent arranged on an opposite side of said substrate from that of said support and facing said support, said bonding agent is an adhesive;
   a semiconductor layer arranged on the substrate;
   a plurality of organic light emitting diodes (OLEDs) arranged in rows and columns in the organic light emitting display device with each of the plurality of organic light emitting diodes arranged on the semiconductor layer;
   an encapsulant arranged on a periphery of the substrate corresponding to an outer periphery of each of the plurality of organic light emitting diodes and the semiconductor layer; and
   an encapsulation substrate attached to the encapsulant,
   wherein the support is on either side of the row of OLEDs, on either side of the column of OLEDs, or surrounding a subset of the plurality of OLEDs but more than a single OLED and less than all the OLEDs in the organic light emitting display device.

2. The organic light emitting display device as claimed in the claim 1, wherein the support and the semiconductor layer are arranged on a same side of the substrate.

3. The organic light emitting display device as claimed in the claim 1, wherein the support is arranged on the outer periphery of the plurality of organic light emitting diodes and the semiconductor layer.

4. The organic light emitting display device as claimed in the claim 1, wherein the support comprises at least one of either an insulating material or a conductive material.

5. The organic light emitting display device as claimed in the claim 1, wherein the support is thinner than the encapsulant.

6. The organic light emitting display device as claimed in the claim 1, wherein the support is thinner than the encapsulant and the encapsulation substrate together.

7. The organic light emitting display device as claimed in the claim 1, wherein the bonding agent is arranged near at least one side of the substrate.

8. The organic light emitting display device as claimed in the claim 1, wherein the bonding agent is arranged on the outer periphery of the encapsulant and the encapsulation substrate.

9. The organic light emitting display device as claimed in the claim 1, wherein the substrate is larger than a range of the encapsulation substrate.

10. The organic light emitting display device as claimed in the claim 1, wherein the substrate has a thickness in a range of 0.05~1 mm.

11. The organic light emitting display device as claimed in the claim 1, wherein the substrate comprises one of a glass, a plastic, a polymer or a steel.

12. The organic light emitting display device as claimed in the claim 1, wherein in further comprising a non-transmissive layer arranged on a side of the substrate opposite to the side thereof having the semiconductor layer arranged thereon.

13. The organic light emitting display device as claimed in the claim 1, further comprising a non-transmissive layer having a thickness in a range of 500 Å to 3,000 Å, the non-transmissive layer being arranged on a side of the substrate opposite to the side thereof having the semiconductor layer arranged thereon.

14. The organic light emitting display device as claimed in the claim 1, further comprising a non-transmissive layer arranged on a side of the substrate opposite to the side thereof having the semiconductor layer arranged thereon, the non-transmissive layer being one of a metal which blocks UV-rays, a transparent UV-ray protective agent, or an opaque UV-ray protective agent.

15. The organic light emitting display device as claimed in the claim 1, further comprising a non-transmissive layer arranged on a side of the substrate opposite to a side thereof having the semiconductor layer arranged thereon, the non-transmissive layer being one of Cr, $Cr_2O_3$, Al, Au, Ag, MgO or a silver alloy.

16. The organic light emitting display device as claimed in the claim 1, further comprising a non-transmissive layer and an anti-friction layer arranged in sequence on a side of the substrate opposite to the side thereof having the semiconductor layer arranged thereon.

17. The organic light emitting display device as claimed in the claim 16, wherein the anti-friction layer has a thickness in a range of 10-100 μm.

18. The organic light emitting display device as claimed in the claim 16, wherein the anti-friction layer comprises at least one of an organic material or an inorganic material.

19. The organic light emitting display device as claimed in the claim 1, further comprising:
   a buffer layer arranged on an underside surface of the semiconductor layer;
   a gate insulation layer arranged on a top surface of the semiconductor layer;
   a gate electrode arranged on a top surface of the gate insulation layer;
   an inter-layer dielectric layer arranged on a top surface of the gate electrode;
   a source/drain electrode arranged on a top surface of the inter-layer dielectric layer;
   an insulation layer arranged on a top surface of the source/drain electrode; and
   each of the plurality of organic light emitting diodes arranged on a top surface of the insulation layer.

20. The organic light emitting display device as claimed in the claim 1, further comprising a driving circuit further arranged on the substrate between the outer periphery of the semiconductor layer and an inner periphery of the encapsulant.

* * * * *